(12) United States Patent
Koo et al.

(10) Patent No.: US 9,236,577 B2
(45) Date of Patent: Jan. 12, 2016

(54) DUAL-MODE DISPLAY DEVICE AND METHOD OF MANUFACTURING SAME

(71) Applicant: Electronics and Telecommunications Research Institute, Daejeon (KR)

(72) Inventors: Jae Bon Koo, Daejeon (KR); Jeong Ik Lee, Gunpo (KR); Chi-Sun Hwang, Daejeon (KR); Hojun Ryu, Seoul (KR); Hye Yong Chu, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 36 days.

(21) Appl. No.: 13/829,882

(22) Filed: Mar. 14, 2013

(65) Prior Publication Data

US 2013/0314634 A1 Nov. 28, 2013

(30) Foreign Application Priority Data

May 22, 2012 (KR) .................. 10-2012-0054404
Nov. 12, 2012 (KR) .................. 10-2012-0127618

(51) Int. Cl.
| | |
|---|---|
| *H01J 1/62* | (2006.01) |
| *H01J 63/04* | (2006.01) |
| *H01L 51/50* | (2006.01) |
| *H01L 51/56* | (2006.01) |
| *H01L 27/32* | (2006.01) |
| *G02F 1/167* | (2006.01) |

(52) U.S. Cl.
CPC ............... *H01L 51/50* (2013.01); *G02F 1/167* (2013.01); *H01L 27/3232* (2013.01); *H01L 51/56* (2013.01); *G02F 2201/44* (2013.01)

(58) Field of Classification Search
CPC .................................... H01L 27/3232
USPC .................................... 313/498–512
See application file for complete search history.

(56) References Cited

U.S. PATENT DOCUMENTS

| | | | |
|---|---|---|---|
| 7,170,506 B2 | 1/2007 | Eldon et al. | |
| 2003/0052869 A1* | 3/2003 | Fujii et al. | 345/204 |
| 2004/0001246 A1* | 1/2004 | Albu et al. | 359/321 |
| 2006/0262242 A1* | 11/2006 | Koma | 349/69 |
| 2011/0249211 A1* | 10/2011 | Song et al. | 349/42 |
| 2011/0267279 A1 | 11/2011 | Alvarez Rivera et al. | |
| 2011/0316899 A1 | 12/2011 | Lan | |

FOREIGN PATENT DOCUMENTS

| | | |
|---|---|---|
| KR | 10-2008-0112673 A | 12/2008 |
| KR | 10-2010-0133451 A | 12/2010 |

* cited by examiner

*Primary Examiner* — Anh Mai
*Assistant Examiner* — Zachary J Snyder

(57) ABSTRACT

Provided are a dual-mode display device and a method of manufacturing the same. The device includes a lower substrate, an upper substrate facing the lower substrate, a thin-film transistor portion between the upper substrate and the lower substrate, a first anode on one side of the thin-film transistor portion, a first cathode between the first anode and the upper substrate, an organic light-emitting layer between the first cathode and the first anode, a second anode on the other side of the thin-film transistor portion, a second cathode between the second anode and the upper substrate, or the second anode and the lower substrate, and a optical switching layer between the second cathode and the second anode.

13 Claims, 15 Drawing Sheets

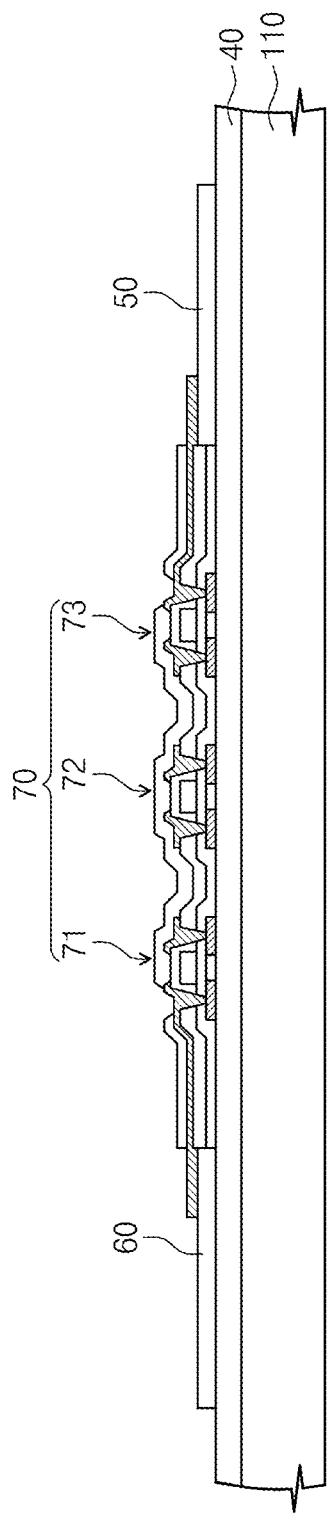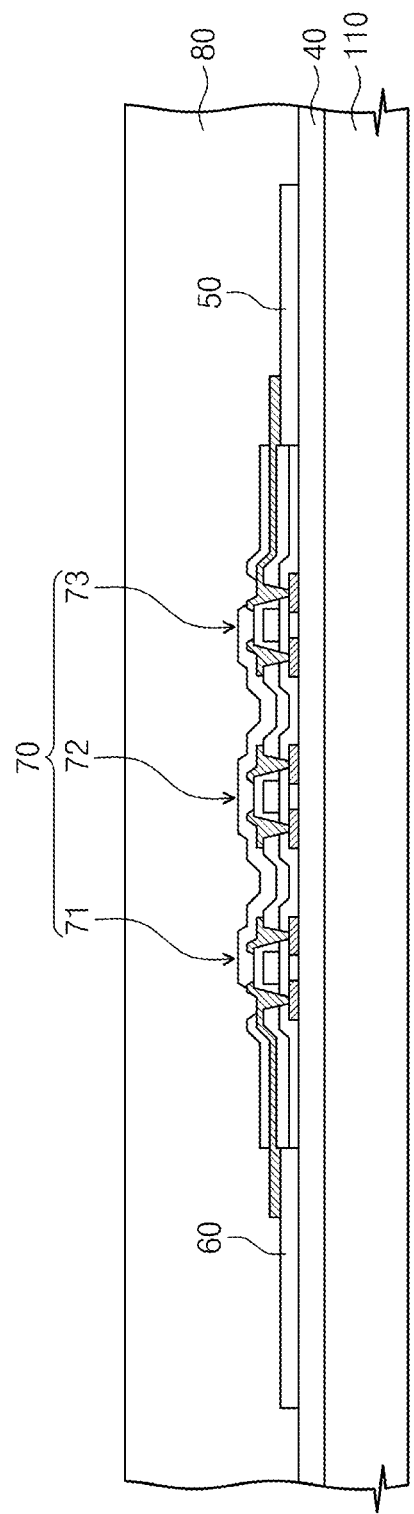

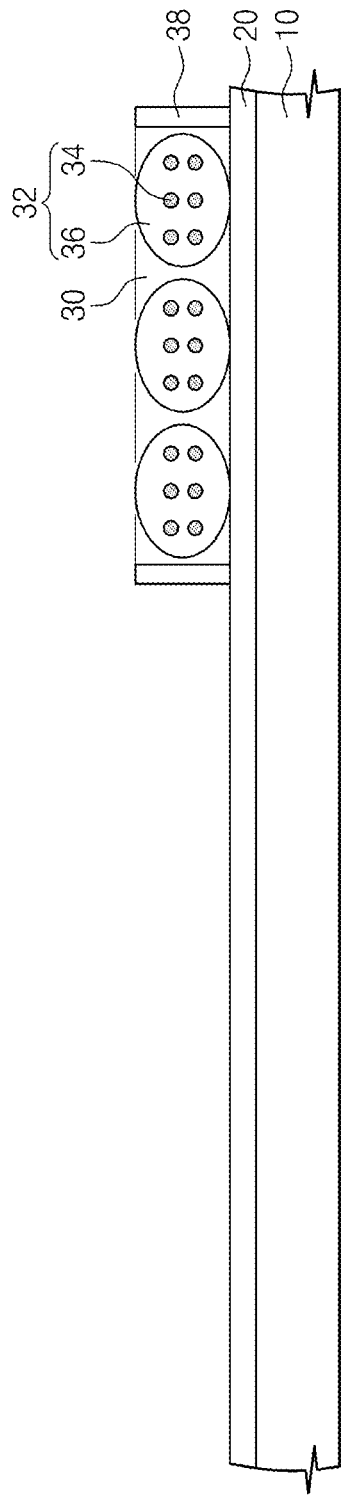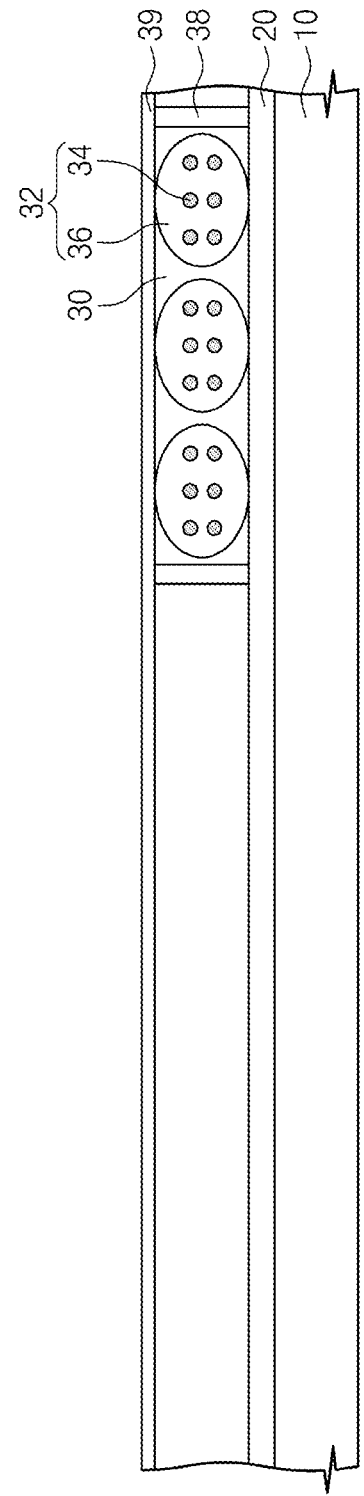

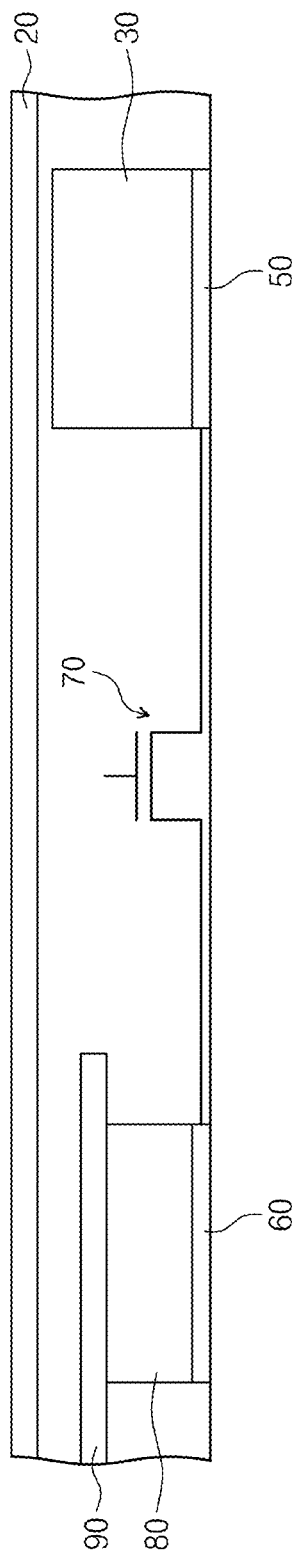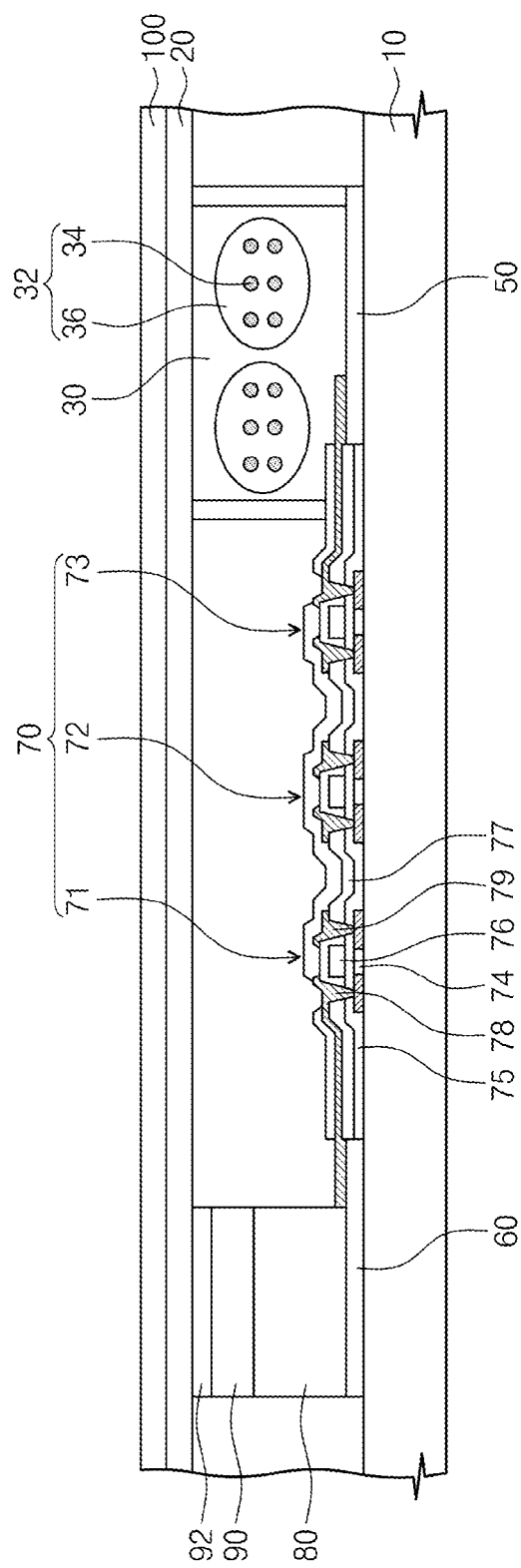

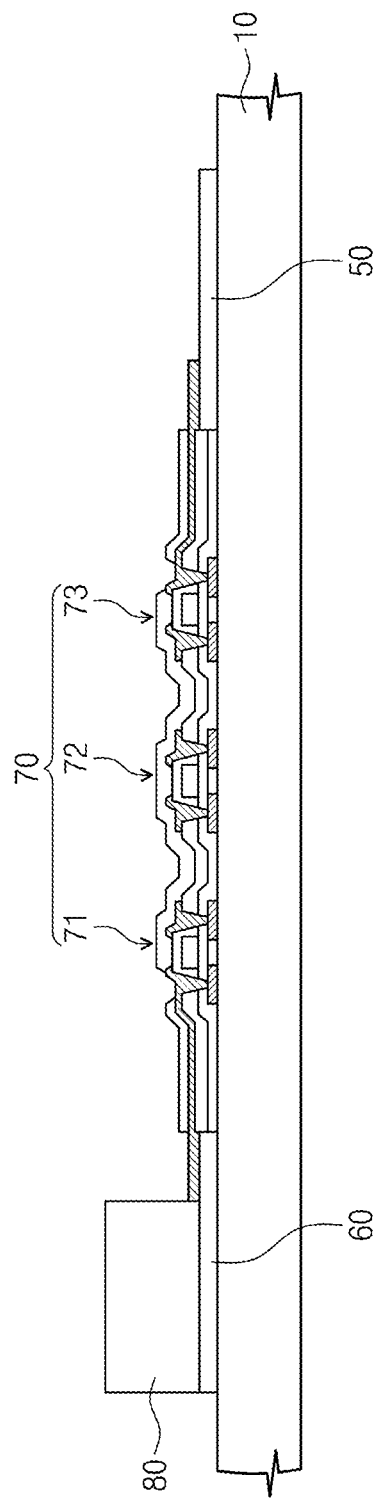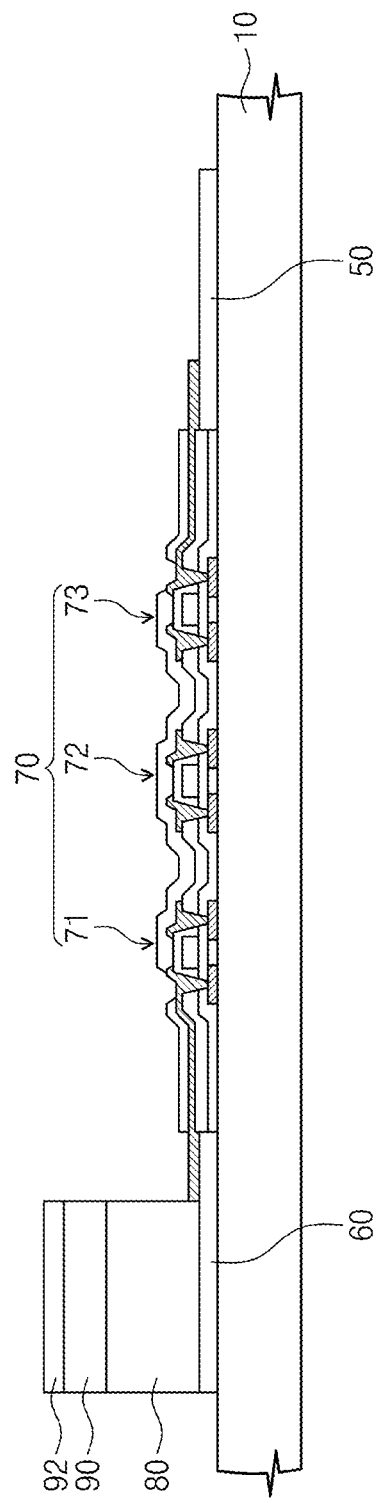

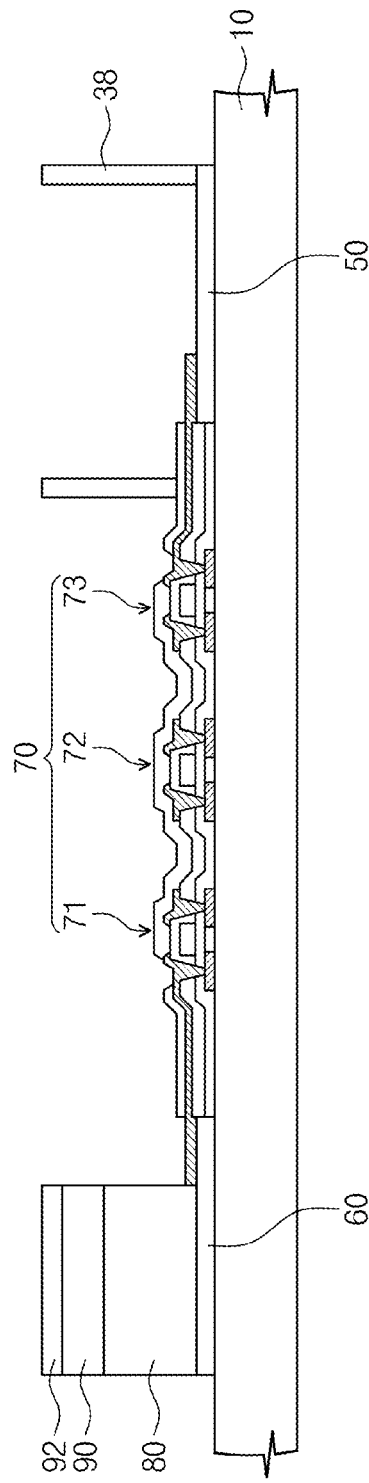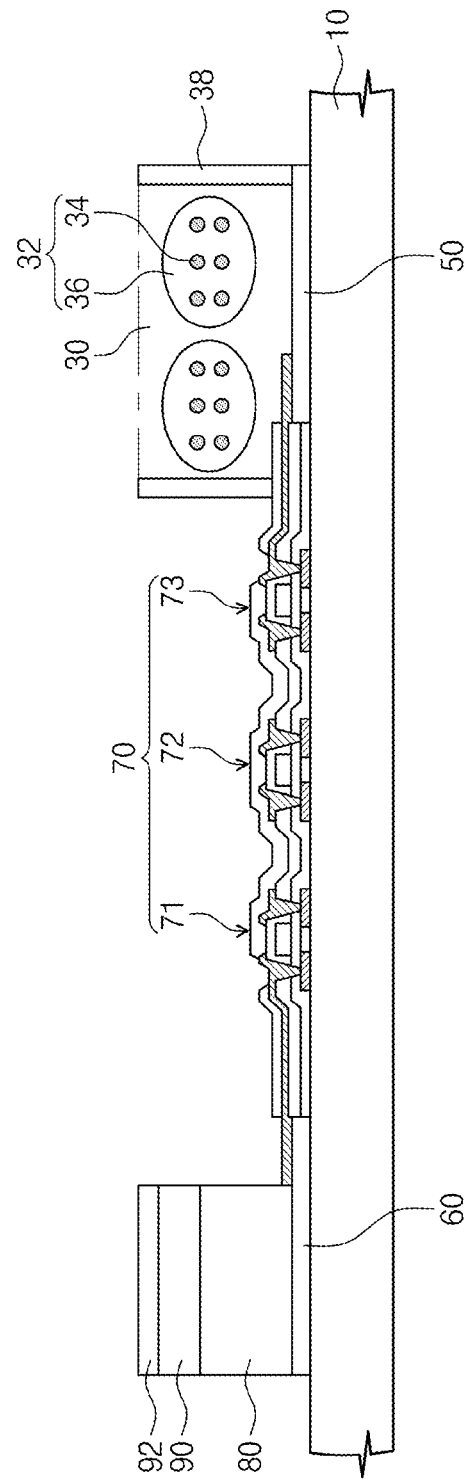

DUAL-MODE DISPLAY DEVICE AND METHOD OF MANUFACTURING SAME

CROSS-REFERENCE TO RELATED APPLICATIONS

This U.S. non-provisional patent application claims priority under 35 U.S.C. §119 of Korean Patent Application Nos. 10-2012-0054404, filed on May 22, 2012, and 10-2012-0127618, filed on Nov. 12, 2012, the entire contents of which are hereby incorporated by reference.

BACKGROUND OF THE INVENTION

The inventive concept disclosed herein relates to a display device and a method of manufacturing the same, and more particularly, to a reflective and self-light emitting dual-mode display device and a method of manufacturing the same.

As modern society develops toward the information age, the importance of a flat panel display (FPD) industry is increasing. The FPD may display pictures by controlling the intensities of transmitted lights or self-emitted lights according to image control signals. The FPD may include a liquid crystal display (LCD) and an organic light-emitting display (OLED) as representative examples.

The LCD may be classified into a transmissive type LCD and a reflective type LCD. The transmissive type LCD may transmit and modulate a white light generated from a backlight to two polarizing plates and a liquid crystal layer. The white light may represent a color passing through a color filter layer. The transmissive type LCD is being widely used for mobile portable equipment, notebooks, computer monitors, TVs, etc., because it may be driven at low voltages. The transmissive type LCD may have low light efficiency because it uses only part of white lights that have been transmitted to the polarizing plate and the color filter layer. However, the backlight has a drawback of increasing the power consumption of the transmissive type LCD. Thus, research and development of the reflective type LCD without the backlight are being actively carried out. The reflective type LCD reflects external lights in a bright environment to represent images.

The OLED is taking center stage as a low-power self-light emitting optical display. The OLED includes a plurality of substrates facing each other, a plurality of electrodes between the substrates, and organic light-emitting materials between the electrodes. The substrates may include a flexible substrate such as a plastic substrate. Thus, the OLED may implement a stretchable display. The organic light-emitting material forms an exciton, a hole and electron pair that is supplied through the electrodes. The exciton is emitted as a light in the organic light-emitting material. Thus, the OLED represents images with self-light.

Recently, the reality is that a need for a dual-mode display device in which the OLED and the reflective type LCD are combined is increasing. The reason is that the dual-mode display device may adapt to external environments and realize ultra power saving.

SUMMARY OF THE INVENTION

The inventive concept provides a dual-mode display device and a method of manufacturing the same that may realize energy saving.

The inventive concept also provides a dual-mode display device and a method of manufacturing the same that may enhance productivity.

Embodiments of the inventive concept provide dual-mode display devices including a lower substrate; an upper substrate facing the lower substrate; a thin-film transistor portion between the upper substrate and the lower substrate; a first anode on one side of the thin-film transistor portion; a first cathode between the first anode and the upper substrate; an organic light-emitting layer between the first cathode and the first anode; a second anode on the other side of the thin-film transistor portion; a second cathode between the second anode and the upper substrate, or the second anode and the lower substrate; and a optical switching layer between the second cathode and the second anode.

In some embodiments, the display device may further include a passivation layer that fixes the thin-film transistor, the first anode, and the second anode.

In other embodiments, the display device may further include an adhesive layer between the passivation layer and the optical switching layer.

In still other embodiments, the adhesive layer may include a polymeric film.

In even other embodiments, the optical switching layer may be arranged between the adhesive layer and the second cathode.

In yet other embodiments, the second cathode between the second anode and the upper substrate may include a reflective metal.

In further embodiments, the first cathode may be arranged between the first anode and the second cathode.

In still further embodiments, the display device may further include an interlayer insulating layer between the first cathode and the second cathode.

In even further embodiments, the interlayer insulating layer may include a silicon oxide film, a silicon nitride film, or a silicon oxide-nitride film.

In yet further embodiments, the thin-film transistor portion may be connected to the first anode and the second anode.

In much further embodiments, the display device may further include a spacer that surrounds the optical switching layer between the second cathode and the second anode.

In still much further embodiments, the optical switching layer may include a photonic crystal layer.

In even much further embodiments, the optical switching layer may include a liquid crystal layer.

In other embodiments of the inventive concept, methods of manufacturing a dual-mode display device, the methods include forming a passivation layer on a dummy substrate; forming a first anode and a second anode on the passivation layer, the first anode and the second anode are spaced apart from each other; forming a thin-film transistor connected to the first anode and the second anode; forming an organic light-emitting layer on the first anode; forming a cathode on the organic light-emitting layer; forming an upper substrate on the first cathode; removing the dummy substrate; forming a second cathode on the lower substrate, the lower substrate faces the upper substrate; forming a optical switching layer on the second cathode; forming an adhesive layer on the optical switching layer; and bonding the adhesive layer to the passivation layer.

In some embodiments, the methods may further include forming a spacer on the second cathode before forming the optical switching layer.

In other embodiments, the dummy substrate may be removed by dry etching, wet etching, or chemical mechanical polishing.

In even other embodiments of the inventive concept, methods of manufacturing a dual-mode display device include forming a first anode and a second anode on a lower substrate that the first anode and the second anode are spaced apart from each other; forming a thin-film transistor portion that is connected to the first anode and the second anode; forming an organic light-emitting layer, a second cathode, and an interlayer insulating layer on the first anode layer; forming a optical switching layer on the second anode; forming a second cathode on the optical switching layer and the interlayer insulating layer; and forming an upper substrate on the second cathode.

In some embodiments, the method may further include forming a spacer surrounding the second anode before forming the optical switching layer.

In other embodiments, the spacer may be formed by a photolithography or printing process.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 3 to 14 are sectional views of processes representing a method of manufacturing the dual-mode display deice according to the first embodiment of the inventive concept on the basis of FIG. 2;

FIG. 15 is a view schematically representing a dual-mode display device according to a second embodiment of the inventive concept;

FIG. 16 is a more specific sectional view of the dual-mode display of FIG. 15; and FIGS. 17 to 24 are sectional views of processes representing a method of manufacturing the dual-mode display device according to the second embodiment of the inventive concept on the basis of FIG. 16.

DETAILED DESCRIPTION OF PREFERRED EMBODIMENTS

It should be construed that foregoing general illustrations and following detailed descriptions are exemplified and an additional explanation of claimed inventions is provided. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Furthermore, when it is described that one comprises (or includes or has) some elements, it should be understood that it may comprise (or include or has) only those elements, or it may comprise (or include or have) other elements as well as those elements if there is no specific limitation. An embodiment described and exemplified herein includes a complementary embodiment thereof Embodiments of the inventive concept will be described in detail below with reference to the accompanying drawings.

Figure 1:
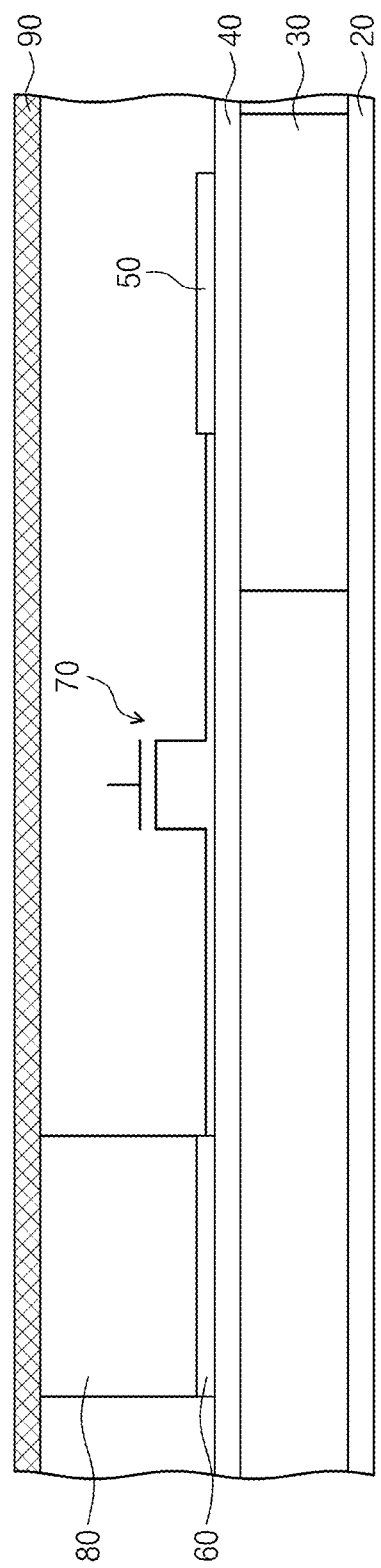
FIG. 1 is a sectional view schematically representing a dual-mode display device according to a first embodiment of the inventive concept.
Figure 2:
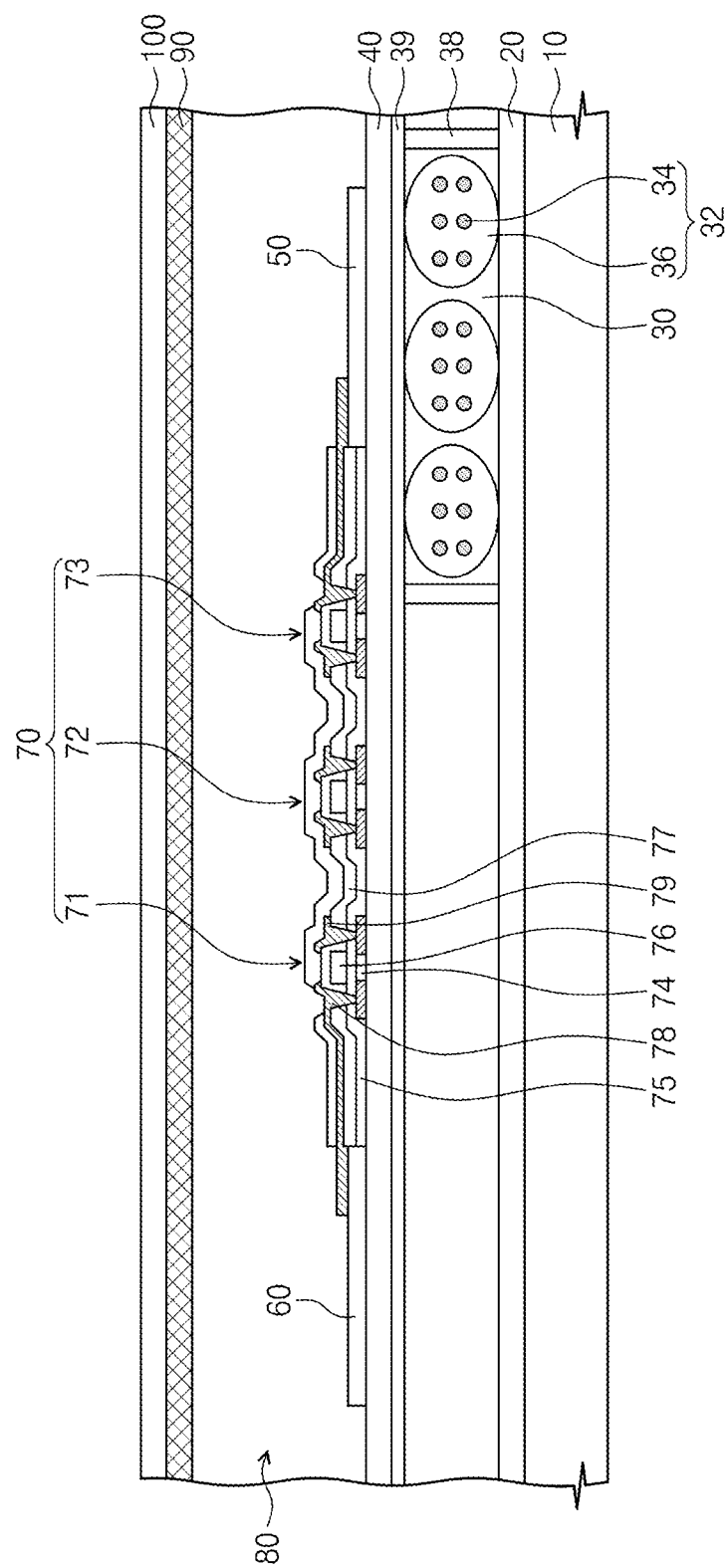
FIG. 2 is a sectional view specifically representing the dual-mode display device of FIG. 1.

FIG. 1 is a sectional view schematically representing a dual-mode display device according to a first embodiment of the inventive concept. FIG. 2 is a sectional view specifically representing the dual-mode display device of FIG. 1.

Referring to FIGS. 1 and 2, the display device according to the first embodiment of the inventive concept may include a lower substrate 10, a second cathode 20, a optical switching layer 30, an adhesive layer 39, a passivation layer 40, a first anode 60, a second anode 50, a thin-film transistor portion 70, an organic light-emitting layer 80, a first cathode 90, and an upper substrate 100.

The lower substrate 10 and the upper substrate 100 may include transparent glass or plastic. The passivation layer 40 is arranged between the lower substrate 10 and the upper substrate 100.

The first anode 60, the second anode 50, and the thin-film transistor portion 70 are arranged on the passivation layer 40. The passivation layer 40 may be the backplane of the first anode 60, the second anode 50, and the thin-film transistor portion 70. The passivation layer 40 may include a silicon oxide film, a silicon nitride film, and a silicon oxide-nitride film.

The thin-film transistor portion 70, the first anode 60, and the second anode 50 may define one sub pixel. The first anode 60 and the second anode 50 may include a transparent metal such as indium tin oxide (ITO) or indium zinc oxide (IZO). The first cathode 90 is arranged between the first anode 60 and the upper substrate 100. The organic light-emitting layer 80 is arranged between the first cathode 90 and the first anode 60. The organic light-emitting layer 80 may be driven by currents between the first anode 60 and the first cathode 90. The currents may be switched by the thin-film transistor portion 70. Although not illustrated, the organic light-emitting layer 80 may include a hole injection layer, a hole transport layer, an emission layer, an electron transport layer, and an electron injection layer. The organic light-emitting layer 80 may implement the self illuminating mode of a display device.

The thin-film transistor portion 70 is connected to the first anode 60 and the second anode 50. The thin-film transistor portion 70 may include a sampling thin-film transistor 71, a driving thin-film transistor 72, and a programming thin-film transistor 73. Each of the sampling thin-film transistor 71, the driving thin-film transistor 72, and the programming thin-film transistor 73 includes an active layer 74, a gate insulating layer 75 on the active layer 74 and the passivation layer 40, a gate electrode 76 on the gate insulating film 75 on the active layer 74, an upper insulating film 77 on the gate electrode 76 and the gate insulating film 75, and a source/drain electrodes 78 and 79 that are each arranged on either side of the gate electrode 76 and are connected to the active layer 74 through the upper insulating film 77 and the gate insulating film 75. The thin-film transistor portion 70 of FIG. 2 is illustrated as a top gate structure. However, this is illustrative and the thin-film transistor portion 70 may have a bottom gate structure.

The thin-film transistor portion 70 may control bias voltages and currents that are applied to the first anode 60 and the second anode 50. The bias voltage is a data signal that is turned on in response to a gate signal. The sampling thin-film transistor 71 may switch the bias voltage. The data signal and the gate signal may be respectively applied through a data line (not illustrated) and a gate line (not illustrated). The current may be supplied from a current source (not illustrated) to the first anode 60.

The driving thin-film transistor 72 and the programming thin-film transistor 73 may switch the bias voltage. The second anode 50 is connected to the drain electrode 79 of the programming thin-film transistor 73. This is illustrative and thus it will be fully understood that the inventive concept is not limited thereto.

The second cathode 20 is arranged on the lower substrate 10. One of the second cathode 20 and the first cathode 90 may be a transparent metal and the other may be a reflective metal. The transparent metal may include ITO or IZO and a transparent conductive material such as silver nanowire, carbon nanotube, graphene, PEDOT:PSS, polyaniline, or polythiophene. The reflective metal may include black metals such as aluminum, copper, or tungsten. For example, if the second cathode is a transparent metal, the first cathode 90 may be a reflective metal. In this case, the dual-mode display device may have a backward mode. If the second cathode 20 is a reflective metal and the first cathode 90 is a transparent metal, the dual-mode display device may have a forward mode.

The optical switching layer 30 is arranged between the second cathode 20 and the passivation layer 40. The adhesive layer 39 is arranged between the passivation layer 40 and the optical switching layer 30. The optical switching layer 30 may transmit or block external lights. The transmission or blockage of external lights may be determined by an electric field that is induced between the second cathode 20 and the second anode 50. The optical switching layer 30 is driven in a reflective mode. The display device may represent reflective mode images in bright spaces.

The optical switching layer 30 may include electrophoretic ink microcapsules 32 or photonic crystal 32. The photonic crystal 32 includes electrophoretic particles 34 and a capsule 36. The electrophoretic particles 34 may be densely in the capsule 36. In this case, the optical switching layer 30 may transmit external lights or self lights. On the other hand, if an electric field is induced between the second cathode 20 and the second anode 50, the electrophoretic particles 34 may be widely spread in the capsule 36. External lights or self lights may be blocked. The optical switching layer 30 may include a liquid crystal layer. The liquid crystal layer may include any one of nematic liquid crystal, smetic liquid crystal and cholesteric liquid crystal. The adhesive layer 39 is arranged between the optical switching layer 30 and the protective layer 40. The adhesive layer fixes the capsule 36. In addition, the adhesive layer 39 may increase the electrical properties between the second cathode 20 and the second anode 50. The adhesive layer 39 may include a polymeric film with resistivity that exceeds a certain value. The passivation layer 40 may include transparent dielectric such as a silicon oxide film or a silicon oxide-nitride film. The adhesive layer 39 may be a laminated liquid crystal protecting film.

Meanwhile, the sub pixel includes the organic light-emitting layer 80 and the optical switching layer 30. The organic light-emitting layer 80 may implement a self lighting mode and the optical switching layer 30 may implement a reflective mode by external lights. A display with the self lighting mode and the reflective mode may operate adaptively to given environments.

Thus, the dual-mode display device according to the first embodiment of the inventive concept may minimize energy consumption.

A method of manufacturing the dual-mode display device according to the first embodiment of the inventive concept configured in this way will be described below.

FIGS. 3 to 14 are sectional views of processes representing a method of manufacturing the dual-mode display deice according to the first embodiment of the inventive concept on the basis of FIG. 2.

Figure 3:
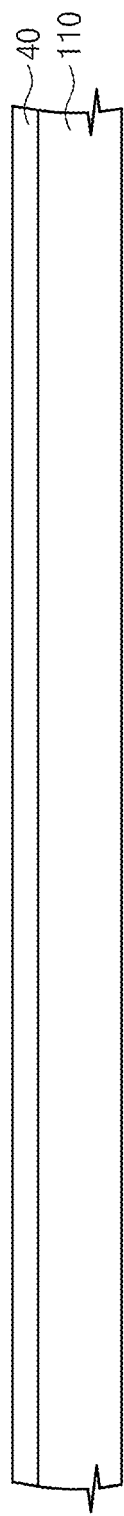

Referring to FIG. 3, the passivation layer 40 is formed on a dummy substrate 110. The passivation layer 40 may be formed by chemical vapor deposition or a rapid thermal process. The passivation layer 40 may include a silicon oxide film, a silicon nitride film, or a silicon oxide-nitride film. The dummy substrate 110 may include a glass substrate or a plastic substrate.

Figure 4:
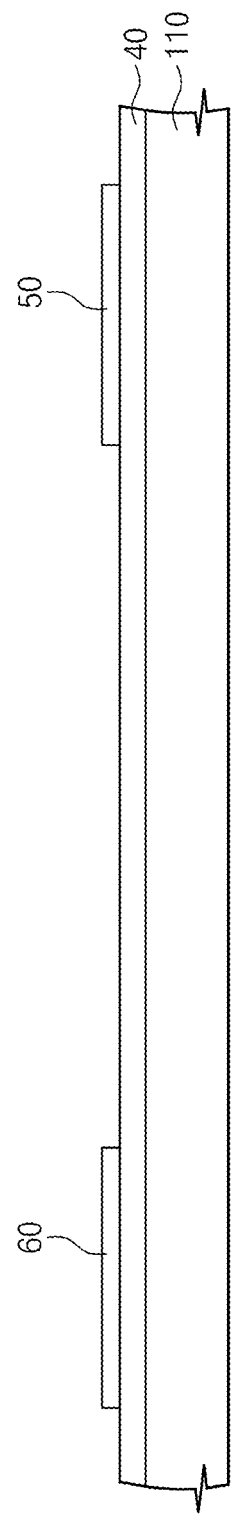

Referring to FIG. 4, the first anode 60 and the second anode 50 are formed on the passivation layer 40. The first anode 60 and the second anode 50 may include transparent metals that are formed by deposition, photolithography and etching processes. The deposition process of the transparent metal may include physical vapor deposition such as sputtering or molecular beam epitaxy (MBE).

Referring to FIG. 5, the thin-film transistor portion 70 is formed. The thin-film transistor portion 70 is connected to the first anode 60 and the second anode 50. The thin-film transistor portion 70 may be formed through a plurality of unit processes. The unit processes include deposition, photolithography, and etching processes. The thin-film transistor portion 70 may include an active layer 74, source/drain electrodes 78 and 79, a gate insulating film 75, an upper insulating film 77, and a metal gate electrode 76. The active layer 74 may include polysilicon. The gate insulating film 75 may include dielectric that is a silicon oxide film. The polysilicon and the dielectric are formed through a deposition process such as chemical vapor deposition. The polysilicon is patterned by photolithography and etching processes. The source/drain electrodes 78 and 79 and the gate electrode 76 may include transparent metals such as ITO. The metal may be formed by a deposition process such as sputtering. In addition, the metal is patterned by photolithography and etching processes.

Referring to FIG. 6, the organic light-emitting layer 80 is formed on the first anode 60. The organic light-emitting layer may be formed by spin coating, sol-gel, or chemical vapor deposition.

Figure 7:
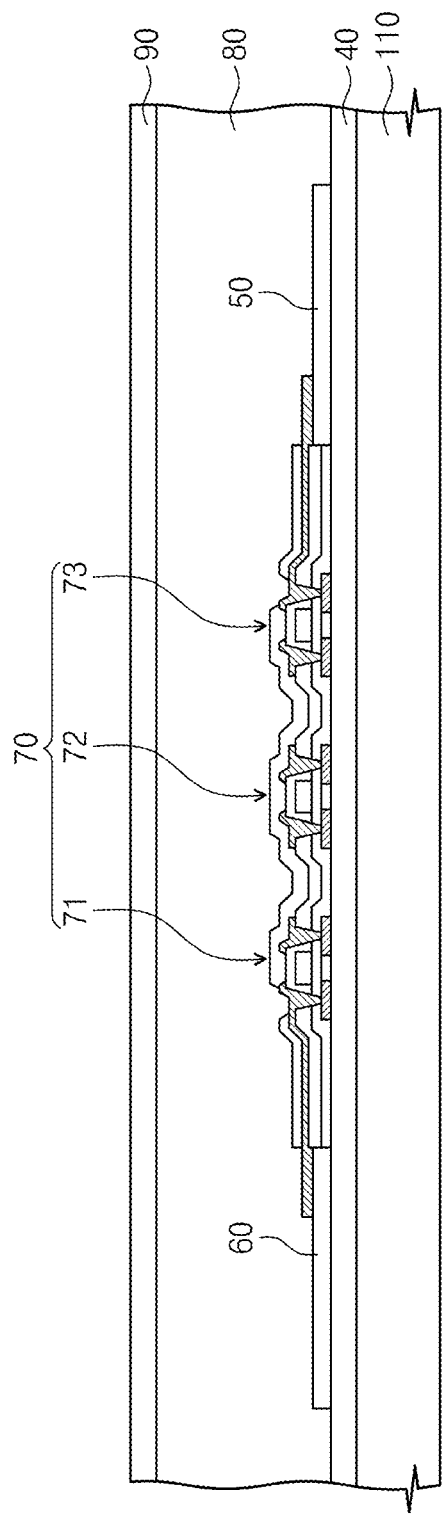

Referring to FIG. 7, the first cathode 90 is formed on the organic light-emitting layer 80. The first cathode 90 may include a reflective metal or a transparent metal that is formed by physical or chemical vapor deposition.

Figure 8:
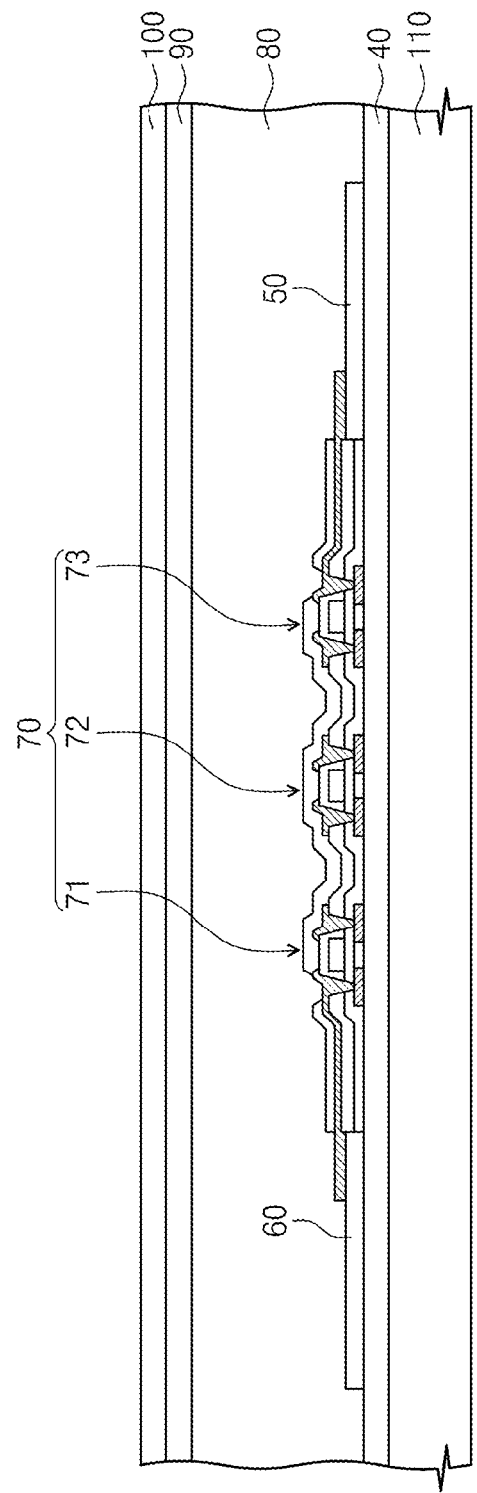

Referring to FIG. 8, the upper substrate 100 is formed on the first cathode 90. The upper substrate 100 may include glass or plastic. The plastic has flexibility. Although not illustrated, the first cathode 90 may be formed on the upper substrate 100 and then bonded onto the organic light-emitting layer 80.

Figure 9:
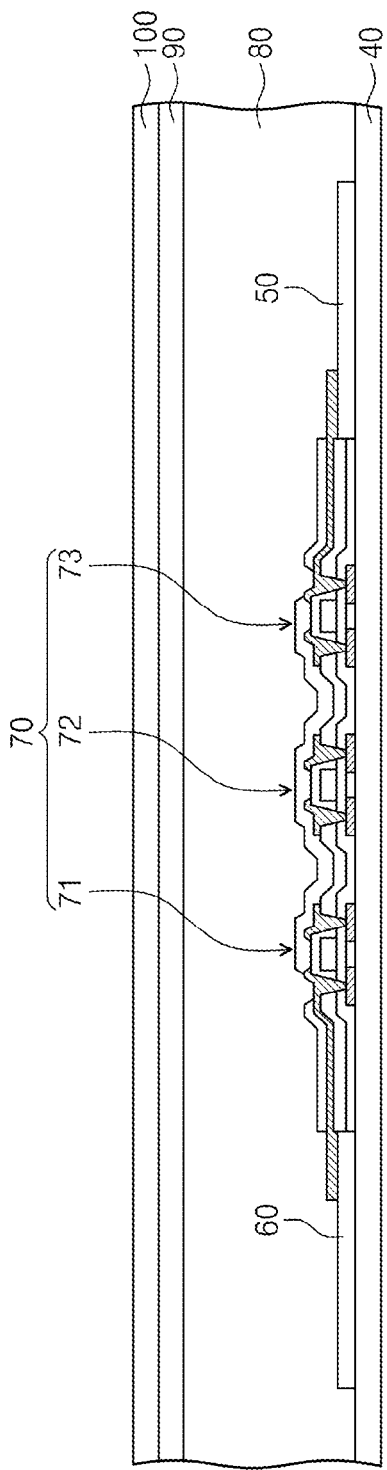

Referring to FIG. 9, the dummy substrate 110 is removed. The dummy substrate 110 may be removed by wet etching, dry etching, or chemical mechanical polishing. The passivation layer 40 may be an etch stop layer when the dummy substrate 110 is removed.

Figure 10:

Referring to FIG. 10, the second cathode 20 is formed on the lower substrate 10 that faces the upper substrate 100. The second cathode 20 may include a reflective metal or a transparent metal that is formed by physical or chemical vapor deposition.

Figure 11:
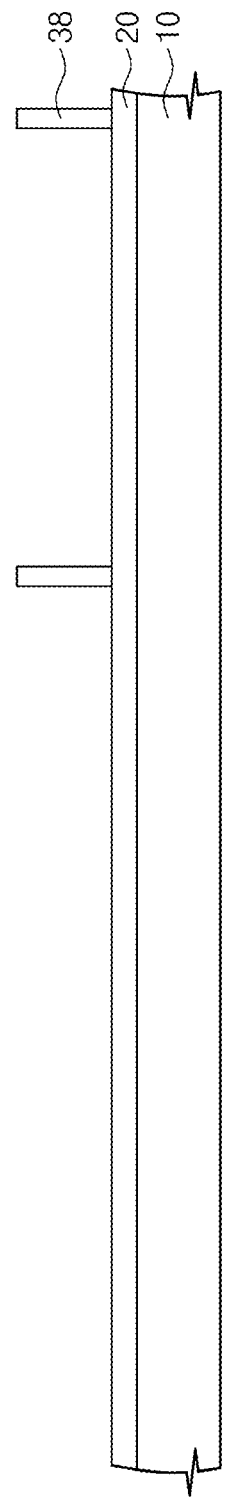

Referring to FIG. 11, a spacer 38 is formed on the second cathode 20. The spacer 38 may include polymers that are formed by a photolithography or printing process.

Referring to FIG. 12, the optical switching layer 30 is formed in the spacer 38 on the second cathode 20. The optical switching layer 30 may be dropped onto the second cathode 20.

Referring to FIG. 13, the adhesive layer 39 is formed on the optical switching layer 30. The adhesive layer 39 may include conductive polymers that are formed by spin coating, physical vapor deposition, or chemical vapor deposition. The optical switching layer 30 may be fixed by the bonding of the lower substrate 10 and the upper substrate 100.

Figure 14:
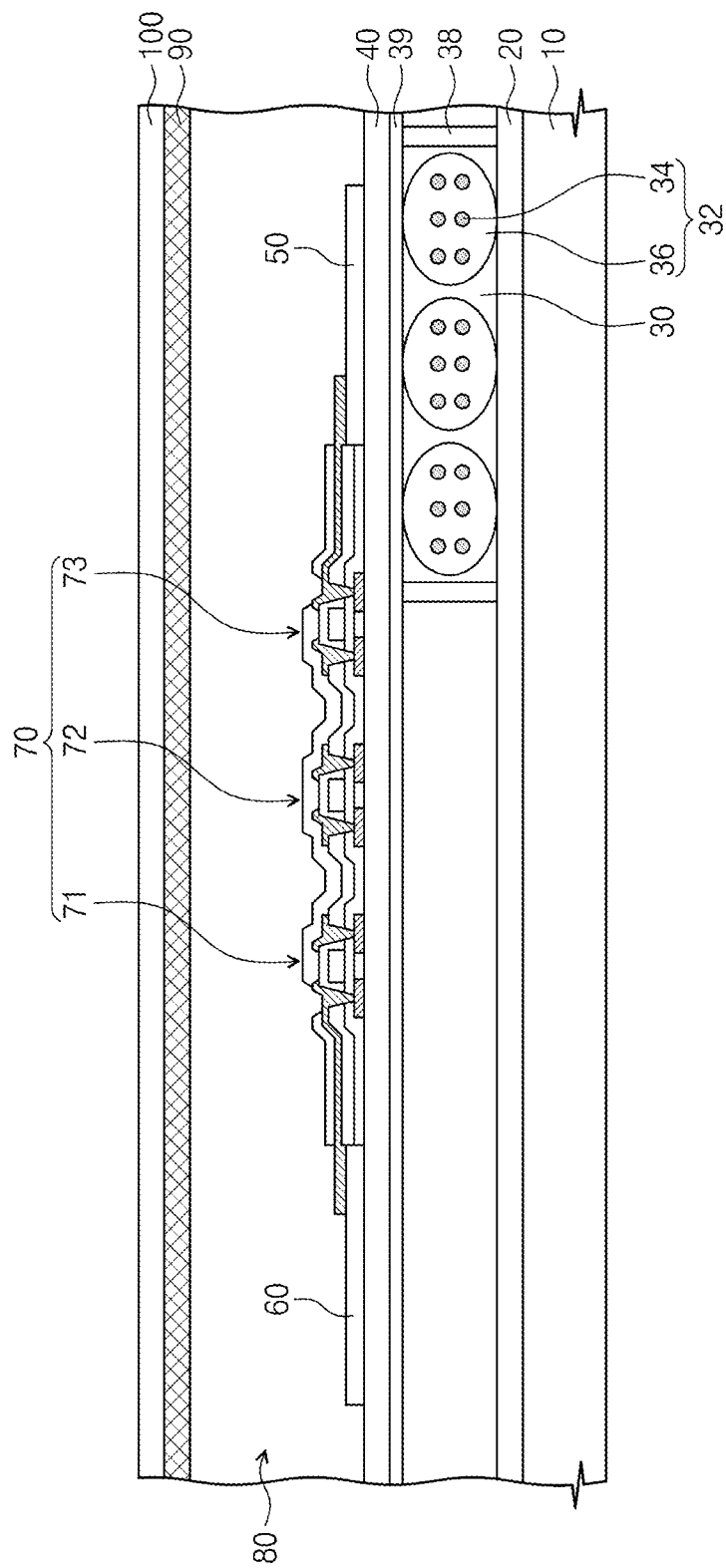

Referring to FIG. 14, the adhesive layer 39 is bonded to the passivation layer 40. The adhesive layer 39 may include an adhesive film that is bonded to the passivation layer 40 by lamination.

FIG. 15 is a view schematically representing a dual-mode display device according to a second embodiment of the inventive concept. FIG. 16 is a more specific sectional view of the dual-mode display of FIG. 15.

Referring to FIGS. 15 and 16, the dual-mode display device according to the second embodiment of the inventive concept may include the optical switching layer 30 and the organic light-emitting layer 80 that are respectively arranged on either side of the thin-film transistor portion 70 between the lower substrate 10 and the upper substrate 100. The organic light-emitting layer 80 is arranged on one side of the thin-film transistor portion 70. The optical switching layer 30 may be arranged on the other side of the thin-film transistor portion 70. In the second embodiment of the inventive concept, the optical switching layer 30 and the organic light-emitting layer 80 of the first embodiment are arranged at the same level between the lower substrate 10 and the upper substrate 100.

The organic light-emitting layer 80 may be driven by the currents between the first anode 60 and the first cathode 90. The first anode 60 is connected to the thin-film transistor portion 70. The first cathode 90 may be arranged only on the first anode 60 and the organic light-emitting layer 80. The first cathode 90 may include a reflective or transparent metal. The organic light-emitting layer 80 may implement the self lighting mode of a display device.

The optical switching layer 30 may be driven by the electric fields between the second anode 50 and the second cathode 20. The second anode 50 and the second cathode 20 may come into contact with the optical switching layer 30. Thus, in the second embodiment of the inventive concept, lower driving voltages may be applied compared to the first embodiment. The second anode 50 is connected to the thin-film transistor portion 70. The second cathode 20 may be arranged on the lower front of the upper substrate 100. The second cathode 20 may include a reflective electrode. The reflective electrode may include black metals such as silver, aluminum, tungsten, or nickel. The optical switching layer 30 may be implemented as a reflective mode of external lights by the second cathode 20. In addition, the external lights may be reflected from the upper substrate 100 to the lower substrate 10. In this case, the direction from the upper substrate 100 to the lower substrate 100 may be defined as a backward mode. Thus, the dual-mode display device according to the first embodiment of the inventive concept may be driven as the backward mode.

An interlayer insulating layer 92 may be formed between the first cathode 90 and the second cathode 20. The interlayer insulating layer 92 may include a silicon oxide film, a silicon insulating film, or a silicon oxide-nitride film. Although not illustrated, the interlayer insulating layer 92 may be arranged on the thin-film transistor portion 70 or the second anode 50. The optical switching layer 30 may be sealed by the spacer 38. The spacer 38 may surround the edge of the second anode 50. The spacer 38 may include polymeric sealant. The optical switching layer 30 may be separated and driven from the organic light-emitting layer 80 at the same level between the lower substrate 10 and the upper substrate 100. The organic light-emitting layer 80 and the optical switching layer 30 may be formed as one sub pixel. A display with a self lighting mode and a reflective mode may be driven depending on whether external lights are provided. A dual-mode display device with the self lighting mode and the reflective mode may minimize energy consumption. Thus, the dual-mode display device according to the second embodiment of the inventive concept may enhance productivity.

A method of manufacturing the dual-mode display device according to the second embodiment of the inventive concept configured in this way will be described below.

FIGS. 17 to 24 are sectional views of processes representing a method of manufacturing the dual-mode display device according to the second embodiment of the inventive concept on the basis of FIG. 16.

Figure 17:
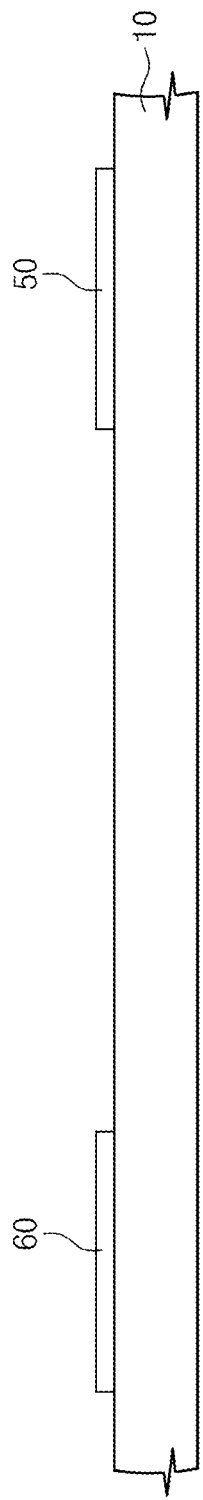

Referring to FIG. 17, the first anode 60 and the second anode 50 are formed on the lower substrate 10. The first anode 60 and the second anode 50 are spaced apart from each other on the lower substrate 10. The first anode 60 and the second anode 50 may be formed by the deposition, photolithography and etching processes of transparent metals. The deposition process may include the sputtering or MBE of the transparent metals.

Figure 18:
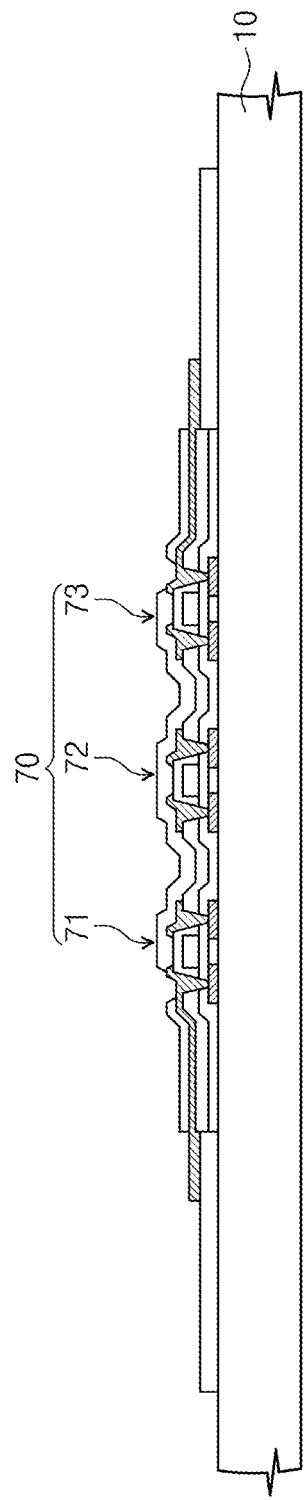

Referring to FIG. 18, the thin-film transistor portion 70 is formed on the lower substrate 10 between the first anode 60 and the second anode 50. The thin-film transistor portion 70 may be formed through a plurality of unit processes. The unit processes include deposition, photolithography, and etching processes.

Referring to FIG. 19, the organic light-emitting layer 80 is formed on the first anode layer 60. The organic light-emitting layer may be formed by spin coating, sol-gel, or chemical vapor deposition.

Referring to FIG. 20, the first cathode 90 and the interlayer insulating layer 92 are formed on the organic light-emitting layer 80. The first cathode 90 may be formed by the deposition, photolithography and etching processes of reflective materials or transparent metals. The deposition process may include physical vapor deposition such as sputtering. The interlayer insulating layer 92 may include a silicon oxide film, a silicon nitride film, and a silicon oxide-nitride film that are formed by chemical vapor deposition. The interlayer insulating layer 92 may be formed on the thin-film transistor portion 70 and the second anode 50 as well as the first cathode 90.

Referring to FIG. 21, the spacer 38 is formed on the edge of the second anode 50. The spacer 38 may include polymers that are formed by a photolithography or printing process.

Referring to FIG. 22, the optical switching layer 30 is formed on the second anode 50 in the spacer 38. The optical switching layer 30 may be dropped onto the second cathode 20.

Figure 23:
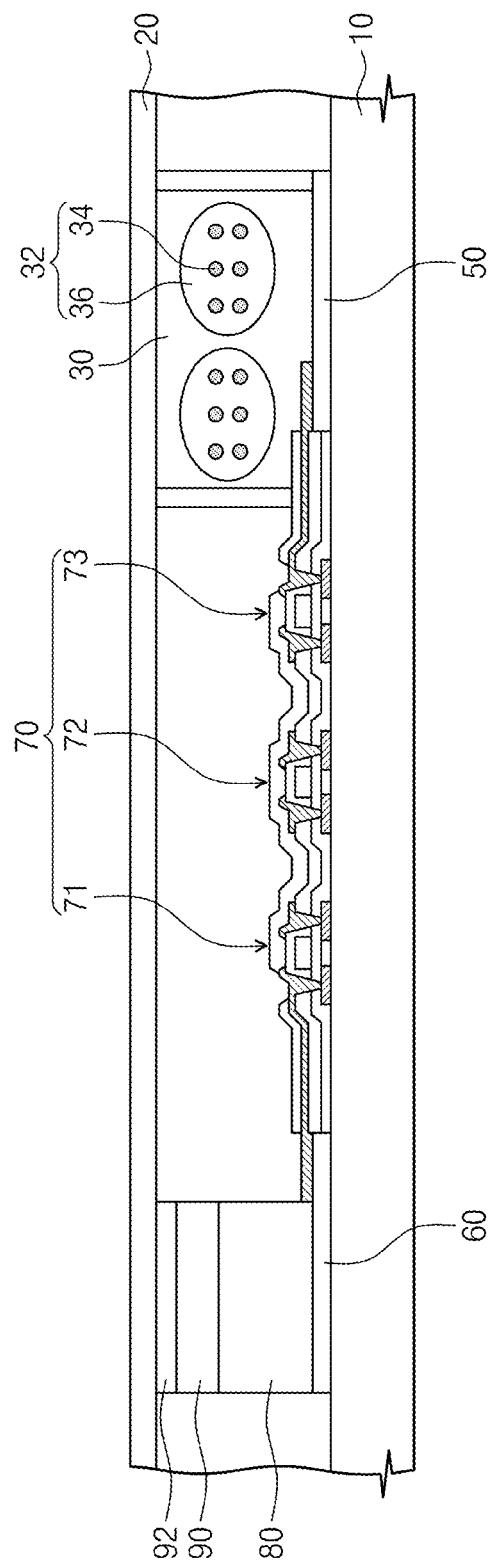

Referring to FIG. 23, the second cathode 20 is formed on the optical switching layer 30. The second cathode 20 may be formed on the upper front of the lower substrate 10. The second cathode 20 may include transparent metals or reflective metals that are formed by physical or chemical vapor deposition.

Figure 24:
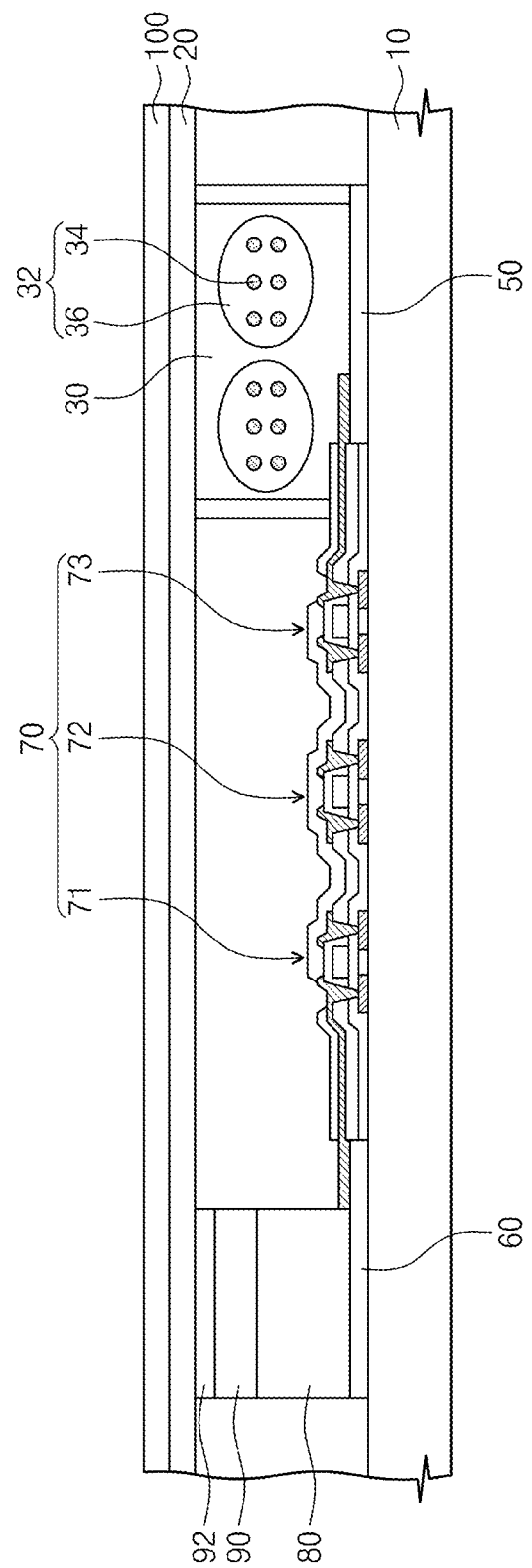

Referring to FIG. 24, the upper substrate 100 is formed on the second cathode 20. The upper substrate 100 may be pressed or welded to the second cathode 20. The upper substrate may include glass or plastic.

The dual-mode display device according to the embodiments of the inventive concept may include an organic light-emitting layer and a optical switching layer that are respectively formed on either side of the thin-film transistor portion between the lower substrate and the upper substrate. The organic light-emitting layer may include images in a self lighting mode. The self lighting mode display device may be effectively driven in dark spaces. A reflective metal may be arranged between the optical switching layer and the upper substrate. The reflective metals and the optical switching layer may represent reflective mode images. The reflective mode images may be represented by external lights. The reflective mode display device may be driven in bright spaces. A dual-mode display device with the self lighting mode and the reflective mode may minimize energy consumption. Thus, the dual-mode display device according to the embodiments of the inventive concept may enhance productivity.

While this invention has been particularly shown and described with reference to preferred embodiments thereof, it will be understood by those skilled in the art that various changes in form and details may be made therein without departing from the spirit and scope of the invention as defined by the appended claims.

The preferred embodiments should be considered in descriptive sense only and not for purposes of limitation. Therefore, the scope of the invention is defined not by the detailed description of the invention but by the appended claims, and all differences within the scope will be construed as being included in the inventive concept. The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A dual-mode display device comprising:
   a lower substrate;
   an upper substrate facing the lower substrate;
   a thin-film transistor portion disposed between the upper substrate and the lower substrate;
   a first anode disposed at one side of the thin-film transistor portion;
   a first cathode disposed between the first anode and the upper substrate;
   an organic light-emitting layer disposed between the first cathode and the first anode;
   a second anode disposed at the other side of the thin-film transistor portion;
   a second cathode disposed between the second anode and the upper substrate, or between the second anode and the lower substrate; and
   an optical switching layer disposed between the second cathode and the second anode,
   wherein the thin-film transistor portion is disposed between the first anode and the second anode, and disposed between the organic light-emitting layer and the optical switching layer, and
   wherein the first anode is on a level with the second anode.

2. The display device of claim 1, further comprising a passivation layer that fixes the thin-film transistor portion, the first anode, and the second anode.

3. The display device of claim 2, further comprising an adhesive layer disposed between the passivation layer and the optical switching layer.

4. The display device of claim 3, wherein the adhesive layer comprises a polymeric film.

5. The display device of claim 3, wherein the optical switching layer is arranged between the adhesive layer and the second cathode.

6. The display device of claim 1, wherein the second cathode disposed between the second anode and the upper substrate comprises a reflective metal.

7. The display device of claim 6, wherein the first cathode is arranged between the first anode and the second cathode.

8. The display device of claim 7, further comprising an interlayer insulating disposed layer between the first cathode and the second cathode.

9. The display device of claim 8, wherein the interlayer insulating layer comprises a silicon oxide film, a silicon nitride film, or a silicon oxide-nitride film.

10. The display device of claim 1, wherein the thin-film transistor portion is connected to the first anode and the second anode.

11. The display device of claim 1, further comprising a spacer that surrounds the optical switching layer disposed between the second cathode and the second anode.

12. The display device of claim 1, wherein the optical switching layer comprises a photonic crystal layer.

13. The display device of claim 1, wherein the optical switching layer comprises a liquid crystal layer.

* * * * *